US007295445B2

(12) United States Patent
My

(10) Patent No.: US 7,295,445 B2
(45) Date of Patent: Nov. 13, 2007

(54) HOLDER FOR SURFACE MOUNT DEVICE DURING REFLOW

(75) Inventor: Jang My, Seoul (KR)

(73) Assignee: Intel Corporation, Santa Clara, CA (US)

( * ) Notice: Subject to any disclaimer, the term of this patent is extended or adjusted under 35 U.S.C. 154(b) by 368 days.

(21) Appl. No.: 10/954,463

(22) Filed: Sep. 30, 2004

(65) Prior Publication Data

US 2006/0067065 A1 Mar. 30, 2006

(51) Int. Cl.
*H05K 7/02* (2006.01)
*H01L 23/12* (2006.01)

(52) U.S. Cl. ...................... 361/782; 361/743; 361/745; 361/760; 361/767; 361/811; 174/260; 257/727; 438/612

(58) Field of Classification Search ................ 361/738, 361/739, 751, 771, 743–746, 748, 750, 760–763, 361/766, 767, 782, 808, 811; 174/250, 260, 174/263; 257/726, 727; 228/44.7, 180.21, 228/180.22; 438/108, 612, 613
See application file for complete search history.

(56) References Cited

U.S. PATENT DOCUMENTS 6,020,645 A * 2/2000 Ooyabu ...................... 257/778
6,509,530 B2 1/2003 Pearson et al.
6,566,611 B2 5/2003 Kochanowski et al.
6,812,565 B2 * 11/2004 Nishimoto et al. ......... 257/723
7,000,312 B2 * 2/2006 Fukunabe et al. ............ 29/843
7,084,353 B1 * 8/2006 Downes ...................... 174/261
7,122,460 B2 * 10/2006 Hua ........................... 438/614
2004/0169275 A1 * 9/2004 Danvir et al. ............... 257/737

* cited by examiner

*Primary Examiner*—Dameon E. Levi
(74) *Attorney, Agent, or Firm*—Blakely, Sokoloff, Taylor & Zafman LLP

(57) ABSTRACT

Methods and apparatus to couple a device, such as, for example, a surface mount device, with a substrate, such as, for example, a printed circuit, are disclosed. An apparatus, according to one aspect, may include a substrate, a plurality of terminals coupled with the substrate, a conductive bonding material coupled with the plurality of terminals, an electronic device coupled with the conductive bonding material, and a holder that is coupled with the substrate to hold the electronic device. A method, according to one aspect, may include coupling a holder with a substrate such that terminals of the substrate are included in an opening of the holder, mounting an electronic device over the terminals with a conductive bonding material disposed therebetween, heating the conductive bonding material to its melting point, and cooling the conductive bonding material.

19 Claims, 5 Drawing Sheets

HOLDER FOR SURFACE MOUNT DEVICE DURING REFLOW

BACKGROUND

1. Field

One or more embodiments of the invention relate to a method and apparatus to couple a device, such as, for example, a capacitor, with a substrate, such as, for example, a printed circuit.

2. Background Information

Capacitors and other devices are may be mounted on printed circuit boards. The capacitors may be physically and electrically coupled with the printed circuit boards through reflow of a solder.

FIG. 1 is an enlarged cross-sectional view showing how a capacitor 120 may be placed on solder bumps 115 that are located on lands 110 of a printed circuit board 105, according to one aspect. Bumps, pads, or other electrical contacts of the capacitor (not shown) may be accurately aligned over the solder bumps and the lands of the printed circuit board.

The solder may be heated until it melts, which may be referred to as reflow. In practice, it may prove difficult to evenly heat all of the solder bumps to the melting point temperature at precisely the same time. Uneven heating of the solder bumps may potentially result in some of the solder bumps melting before others. For example, the right-hand solder bump of FIG. 1 may melt before the left-hand solder bump. The melted solder may exert forces on the capacitor, such as, for example, due at least in part to surface tension. Such forces may be exerted to a lesser extent or not at all by the un-melted solder bump. This may result in an unbalanced force on the capacitor, which may potentially result in the capacitor moving relative to one or more of the lands.

This may potentially result in defects. Commonly encountered defects include, but are not limited to, tombstoning and misalignment of the capacitor.

FIG. 2 is an enlarged cross-sectional view showing how the capacitor may tombstone, according to one aspect. As shown by the arrow, the left-hand end of the capacitor may lift off of the left-hand land.

FIG. 3 is an enlarged top-planar view showing how the capacitor may misalign, according to one aspect. As shown by the arrow, the left-hand end of the capacitor may rotate away from the left-hand land.

Manual correction of tombstoning and misalignment may be possible. However, such manual correction may be time consuming, expensive, and/or may limit production.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, it is understood that embodiments of the invention may be practiced without these specific details. In other instances, well-known circuits, structures and techniques have not been shown in detail in order to avoid obscuring the understanding of this description.

Figure 4:
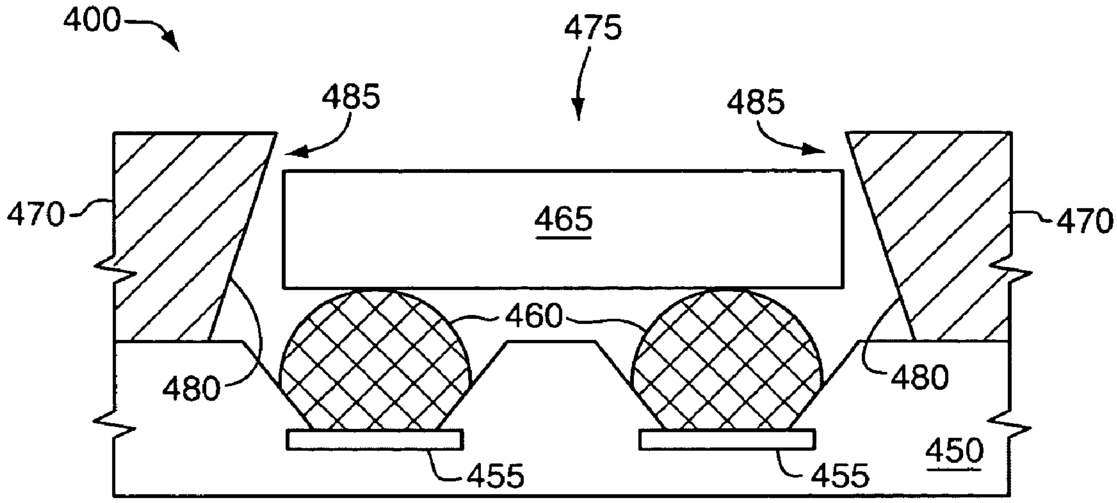
FIG. 4 shows an enlarged cross-sectional view of an apparatus including a substrate, a plurality of terminals, a conductive bonding material, an electronic device, and a holder to hold the electronic device, according to one or more embodiments of the invention.

FIG. 4 shows an enlarged cross-sectional view of an apparatus 400 including a substrate 450, a plurality of terminals 455, a conductive bonding material 460, an electronic device 465, and a holder 470 to hold the electronic device, according to one or more embodiments of the invention. The terminals are coupled with the substrate. The conductive bonding material is coupled with the terminals. The electronic device is coupled with the conductive bonding material. The holder is coupled with the substrate.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical contact with each other. "Coupled" may mean that two or more elements are in direct physical or electrical contact. However, "coupled" may also mean that two or more elements are not in direct contact with each other, but yet still co-operate or interact with each other. For example, as shown in the illustrated embodiment, the electronic device may be coupled with the terminals and/or the substrate through the solder bumps disposed therebetween.

The substrate may include a substrate including a circuit, such as, for example, a printed circuit board, printed wiring board, flexible printed circuit, or other printed circuit, to name just a few examples. In one aspect, the substrate may be for flip-chip ball grid array (FCBGA), although the scope of the invention is not limited in this respect.

The substrate includes the plurality of terminals coupled therewith and connected thereto. Suitable terminals include, but are not limited to, lands, pads, vias, interconnects, other conductive materials, and combinations thereof. A wide variety of terminal designs and/or metallurgies are known in the arts and are suitable. The illustrated terminals are embedded in the substrate, although the invention is not limited in this respect. In one or more alternate embodiments, the terminals may overly a surface of the substrate.

The conductive bonding material, such as, for example, a solder, or other metal bonding material, may be coupled with and connected to the plurality of terminals. Suitable solders include, but are not limited to, tin-lead eutectic solders and lead-free solders, such as, for example, tin-silver and/or tin-silver-copper solders. The conductive bonding material may be in the form of balls and/or bumps, to name just a few possibilities. The balls or bumps may optionally be coined, such that they may have a flattened top (not shown), such as, for example, in order to help reduce tombstoning and misalignment, although this is not required.

The electronic device is coupled with and connected to the conductive bonding material. Suitable electronic devices include, but are not limited to, passive and active surface mount devices. A surface mount device may include a component or other device that may be mounted onto a substrate using surface mount technology, rather than into a substrate with the use of pins, for example. Non-limiting examples of passive surface mount devices include capacitors, resistors, and inductors. Specific examples of suitable capacitors include, but are not limited to, monolithic ceramic capacitors and tantalum capacitors. Specific examples of suitable resistors include, but are not limited to, thick film resistors and thin film resistors. Non-limiting examples of active surface mount devices include transistors and microelectronic devices, such as, for example, integrated circuits. However, the scope of the invention is not limited to these particular devices. For example, quad flat-packs, dual in-line packages, gull-wing packages, 0402 arrays (i.e. two or more 0402 components coupled together), and/or other devices may also optionally be mounted. Such devices may be mounted or otherwise coupled with the terminals through the conductive bonding material. The illustrated electronic device includes a two-terminal device, such as, for example, a capacitor, which is coupled with two terminals of the substrate, although the scope of the invention is not limited in this respect.

The holder is coupled with and connected to the substrate and may hold the electronic device in place, such as, for example, during reflow. The holder may help to keep the electronic device in its intended position in which it is coupled with the conductive bonding material and terminals. In one aspect, the holder may restrain the electronic device to help to prevent, or at least reduce, movement of the electronic device, which may potentially lead to defects, such as tombstoning and/or misalignment, for example. In holding the electronic device, in one or more embodiments of the invention, the holder may contact the electronic device to help to keep it from moving. However, it is not required that the holder contact the electronic device, although it may. According to one or more embodiments of the invention, the holder may not contact the electronic device unless and until the electronic device starts to move out of its intended position, at which point the holder and electronic device may contact. As before, the contact may help to prevent, or at least reduce, further movement of the electronic device. In one aspect, such restraint of movement of the electronic device may help to retain coupling of the electronic device with the terminals and reduce defects, such as, for example, tombstoning and/or misalignment.

The illustrated holder includes a film or other layer, which includes a centralized or otherwise interior hole 475, and which is coupled with and connected to the substrate. As used herein, the term layer may refer broadly to a thickness of a material over a region of the substrate. The layer may be deposited, laminated, attached, or otherwise coupled with the substrate.

Figure 5:
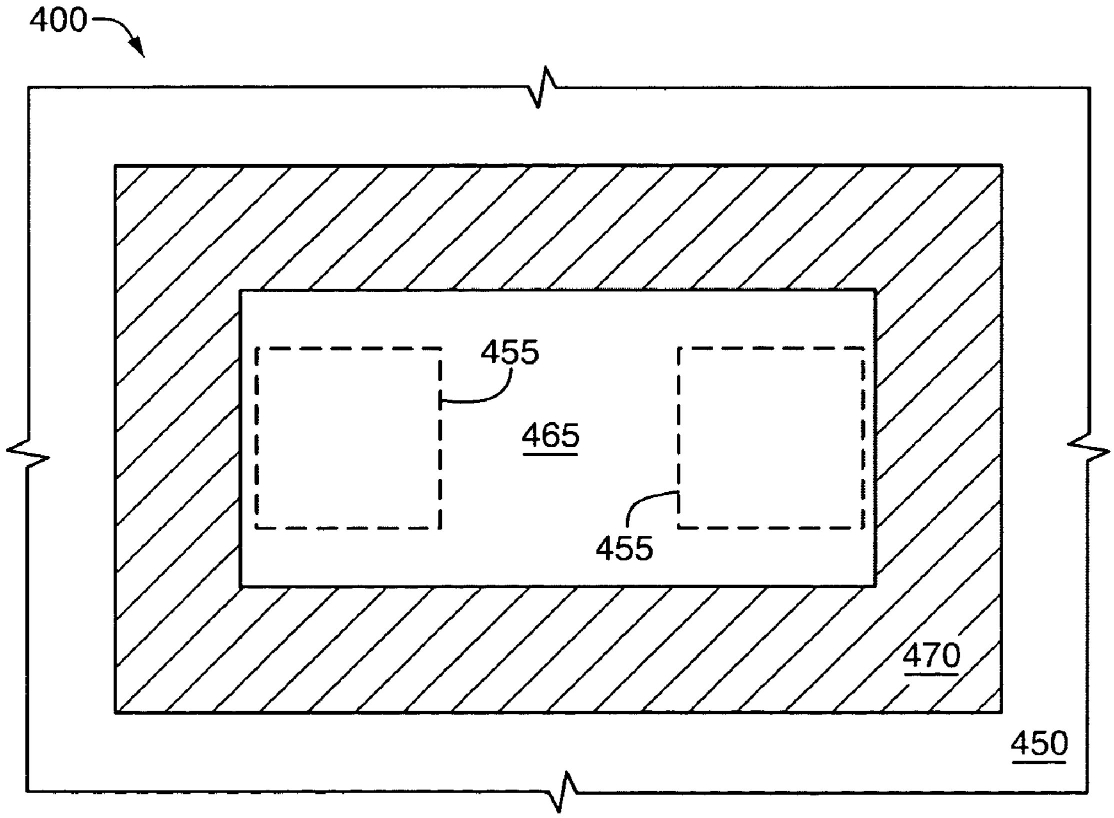
FIG. 5 shows an enlarged top-planar view of the apparatus of FIG. 4, according to one or more embodiments of the invention.

As shown in FIG. 5, which shows a top-planar view of the apparatus 400, according to one or more embodiments of the invention, the holder 470 may include a layer formed over and around a region of the substrate 450 that includes the electronic device 465 and/or the terminals 455 (shown dashed to illustrate they may be hidden from view by the electronic device). In one or more embodiments of the invention, the layer may include an internal opening and form a ring around a periphery of the region. As used herein, the term “ring” does not necessarily imply circularity. The ring may have a circular, rectangular, square, triangular, polygonal, curvilinear, or other closed plane shape. For example, as shown in the illustrated embodiment, the ring may have a rectangular shape that may correspond closely to the size and shape of the electronic device, which as illustrated may also optionally be rectangular. The dimensions of the layer may range from a thin band closely conforming to the periphery of the region to a much larger layer overlying a large region of the substrate. The invention is not limited to the particular illustration, which is not necessarily drawn to scale.

Figure 1:
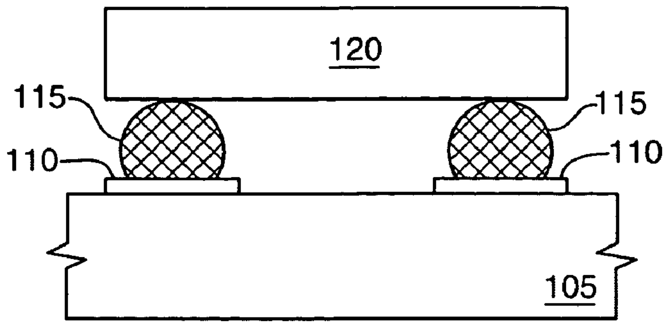
FIG. 1 is an enlarged cross-sectional view showing how a capacitor may be placed on solder bumps that are located on lands of a printed circuit board, according to one aspect.
Figure 2:
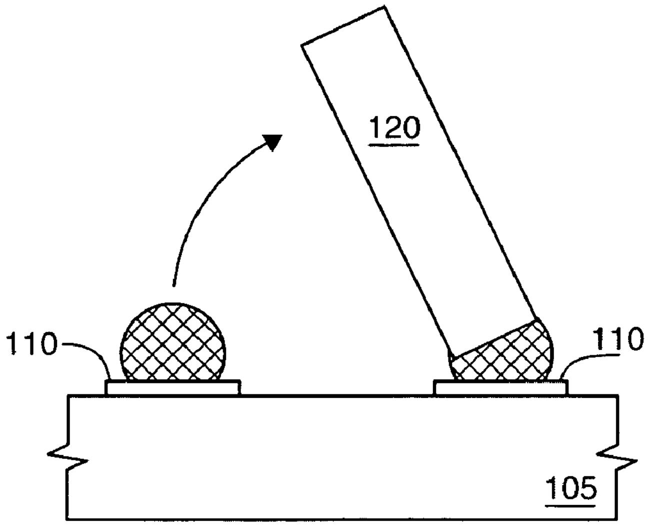
FIG. 2 is an enlarged cross-sectional view showing how the capacitor may tombstone, according to one aspect.
Figure 3:
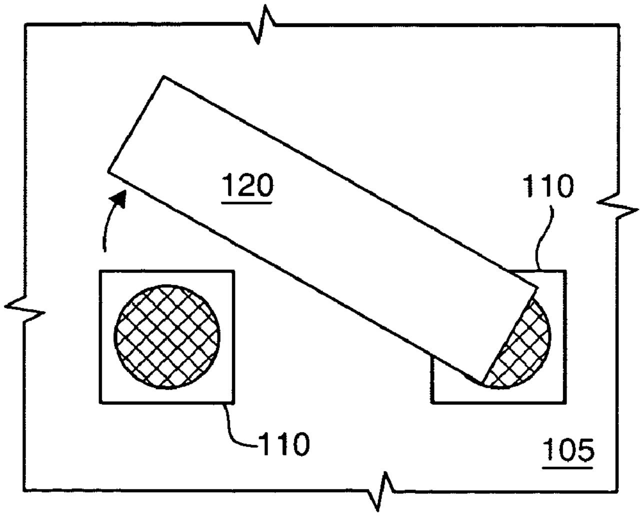
FIG. 3 is an enlarged top-planar view showing how the capacitor may misalign, according to one aspect.

As well shown in FIG. 1, the holder includes sidewalls 480. As shown in the illustrated embodiment, the sidewalls may be beveled, inclined, slanted, or otherwise oblique. The oblique sidewalls are not perpendicular to the base, but as illustrated may slant or lean inward toward the electronic device and/or the terminals. In one aspect, the sidewalls may form an angle with the horizontal surface of the substrate that may be in the range of from about 60° to 90°, although this is not required, nor is it required to have oblique sidewalls.

As further shown, the thickness of the layer or other height of the holder over the horizontal surface of the substrate may be greater than a height of the electronic device as it may be placed on the conductive bonding material. In one aspect, depending upon the size of the electronic device, the holder may have a thickness or height that is in the range of from 200 to 500 μm, for example, although the scope of the invention is not limited in this respect. The sidewalls may include overhangs 485. The illustrated overhangs include an angled top of the sidewalls, although this is not required. Other suitable overhangs include, but are not limited to, upper ledges, for example.

In one or more embodiments of the invention, the overhangs may not hang over the electronic device at ambient temperatures, such as, for example, about 25° C., which may provide greater accessibility for mounting the electronic device on the conductive bonding material. However, in one or more embodiments of the invention, the overhangs may hang over the electronic device at elevated temperatures, such as, for example, at a temperature that may be slightly below a reflow temperature of the solder or other conductive bonding material, due at least in part to thermal expansion of the holder in the direction toward the electronic device.

Compared to strictly perpendicular or vertical sidewalls without an overhang, the oblique sidewalls and/or overhangs may potentially help to restrain movement of the electronic device. For example, the oblique sidewalls and/or overhangs may help to prevent, or at least reduce, the lifting of an end of the electronic device off of a conductive bonding material, which may potentially help to reduce tombstoning.

A variety of different materials may optionally be included in the holder. In one or more embodiments of the invention, the holder may include an organic material, such as, for example, a polymeric material, that may remain sufficiently solid and thermally stable up to the melting point temperature and/or reflow temperature of the conductive bonding material. Suitable polymers include, but are not limited to, polyimide resins, such as, for example, Kapton® available from Dupont, thermoset bismaleimide resins, polyamide-imides, polyaryletherketones, polyetheretherketones, perfluoroalkoxys, polytetrafluoroethylenes, polyphenylene sulfides, fluorinated ethylene propylenes, and polyphenylene sulfones. Combinations of these materials are also suitable.

In one or more embodiments of the invention, the holder may optionally include a material having a coefficient of thermal expansion that may be greater than that of the substrate, such as, for example, a printed circuit board, although this is not required. An exemplary printed circuit board may have a coefficient of thermal expansion of not more than about $30\times10^{-6}/°$ C. at alpha1 stage. Suitable materials for the holder which have a coefficient of thermal expansion greater than this include, but are not limited to, perfluoroalkoxy, polytetrafluoroethylene polymers, and perfluoroalkoxy. Including such materials in the holder may help to allow the holder to expand to contact the electronic device.

FIGS. 6-10 show enlarged cross-sectional views of assemblies representing different stages of a method of mounting an electronic device on a substrate, according to one or more embodiments of the invention. The substrates, terminals, conductive bonding materials, electronic devices, and holders may optionally have some or all of the characteristics of the correspondingly named components discussed above. To avoid obscuring certain concepts, the discussion below will primarily focus on the different and/or additional structures and characteristics.

Figure 6:
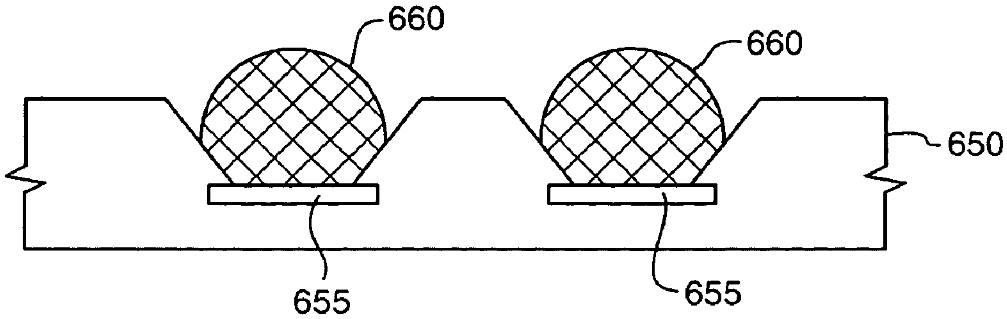
FIG. 6 shows an assembly including a substrate, terminals coupled with the substrate, and conductive bonding material coupled with the terminals, according to one or more embodiments of the invention.

FIG. 6 shows an assembly including a substrate 650, terminals 655 coupled with the substrate, and conductive bonding material 660 coupled with the terminals, according to one or more embodiments of the invention. In one aspect, the conductive bonding material, such as, for example, the solder, may have been just previously been selectively coated or otherwise applied to the lands or other terminals of the substrate.

Figure 7:
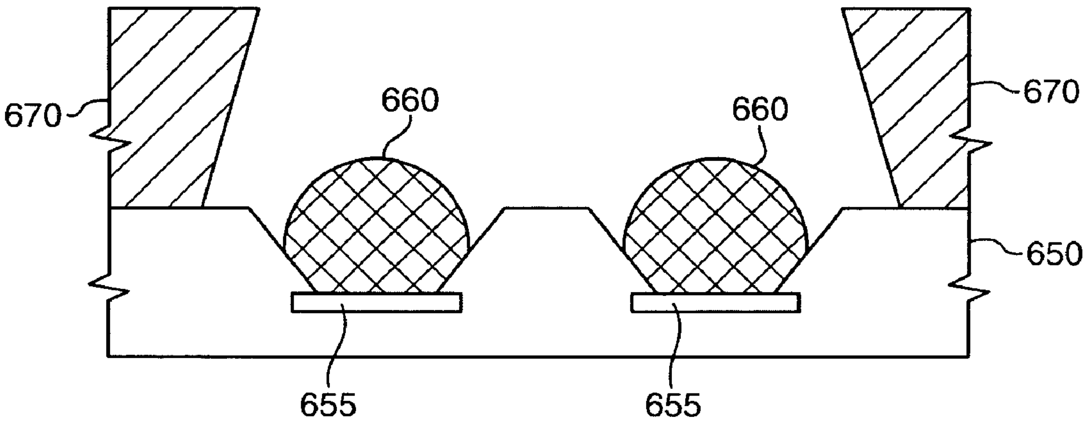
FIG. 7 shows an assembly after coupling a holder with the substrate of the assembly of FIG. 6, according to one or more embodiments of the invention.

FIG. 7 shows an assembly after coupling a holder 670 with the substrate of the assembly of FIG. 6, according to one or more embodiments of the invention. As shown, the holder may be coupled with the substrate such that the terminals of the substrate are included in an opening of the holder.

In one or more embodiments of the invention, the holder may be coupled with the substrate through printing, such as, for example, stencil screen printing. An optional post-printing thermal or other cure may optionally be used. Alternatively, in one or more embodiments of the invention, a preformed holder may be coupled with the substrate. The preformed holder may be formed. In one aspect, the preformed holder may be molded with the shape of the mold used to provide oblique sidewalls and/or overhangs. Then, the preformed holder may be attached to an adhesive, such as, for example, tape. Then, the tape having the preformed holder attached thereto may be coupled with the substrate, such as, for example, by using pick-and-placed. Alternatively, a sticky preformed holder may be used without a separate adhesive. However, the invention is not limited to coupling the holder with the substrate by these approaches.

Figure 8:
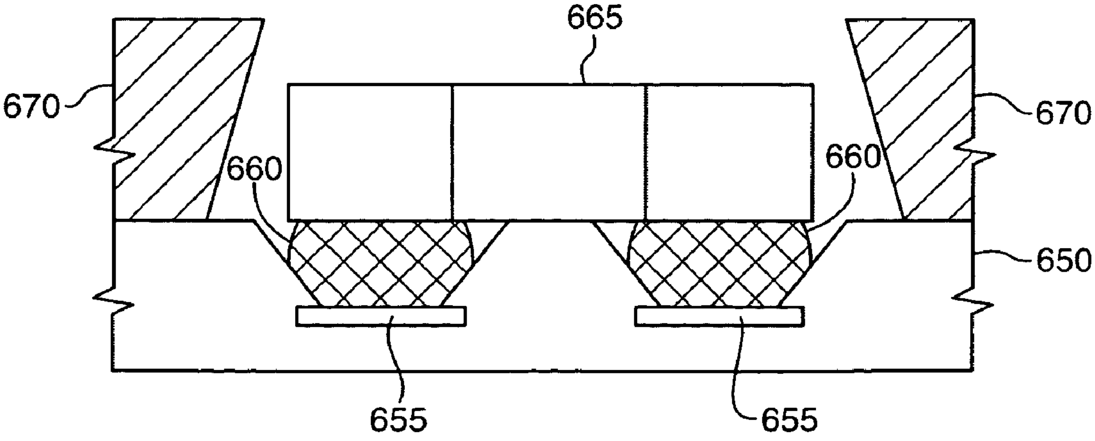
FIG. 8 shows an assembly after mounting an electronic device over the terminals of FIG. 7 with the conductive bonding material disposed therebetween, according to one or more embodiments of the invention.

FIG. 8 shows an assembly after mounting an electronic device 665 over the terminals of FIG. 7 with the conductive bonding material disposed therebetween, according to one or more embodiments of the invention. In mounting the electronic device, the terminals of the electronic device may be positioned or registered over the terminals of the substrate. In the illustrated embodiment, the conductive bonding material is already over the terminals, although this is not required. In one or more alternate embodiments of the invention, the conductive bonding material may be included under the terminals of the electronic device; or else some conductive bonding material may be included under the terminals of the electronic device and other conductive bonding material may be included over the terminals of the substrate.

Figure 9:
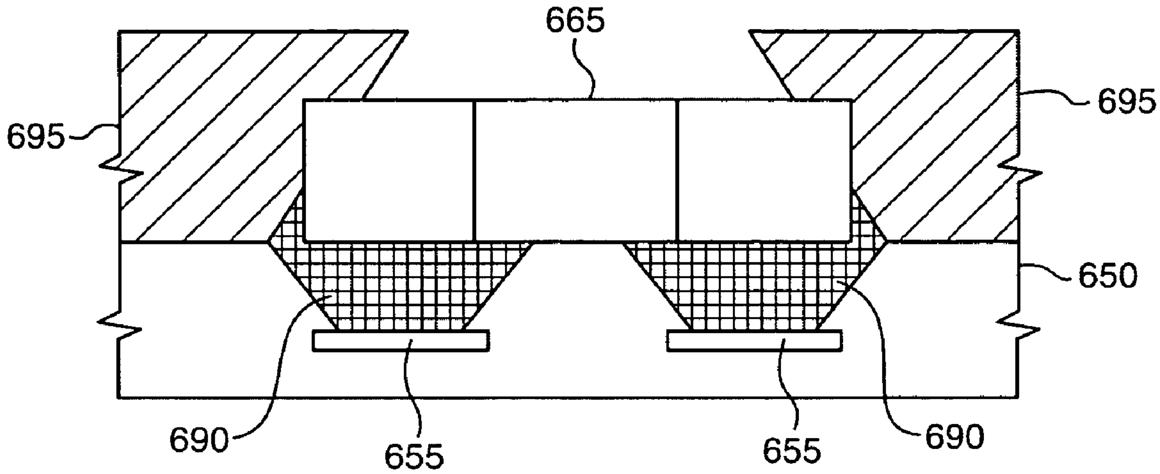
FIG. 9 shows an assembly after heating the assembly of FIG. 8 to form softened, melted, and/or reflowed conductive bonding material, according to one or more embodiments of the invention.

FIG. 9 shows an assembly after heating the assembly of FIG. 8 to form softened, melted, and/or reflowed conductive bonding material 690, according to one or more embodiments of the invention. In one or more embodiments, the heating may be performed in an oven, although this is not required. The temperature to which the assembly may be heated may depend upon the particular conductive bonding material. The reflow temperature of a tin-lead solder may range from about 220 to 240° C. The reflow temperature of a tin-silver-type of lead free solder may range from about 240 to 260° C. The scope of the invention is not limited to any known temperature.

The heating and increased temperature may also result in a thermally expanded holder 695. As shown in the illustrated embodiment, the holder may optionally be sized and arranged to contact the electrical device at a temperature just lower than the melting point temperature of the solder in order to help hold and restrain movement of the electronic device that may otherwise occur due at least in part to surface tension forces. For example, the contact may occur at a temperature of from about 1 to 50° C., or 5 to 20° C., lower than the melting point temperature, to name just a few examples. After heating, the assembly including the conductive bonding material may then be cooled to harden and/or solidify the conductive bonding material. The thermally expanded holder may also contract.

Figure 10:
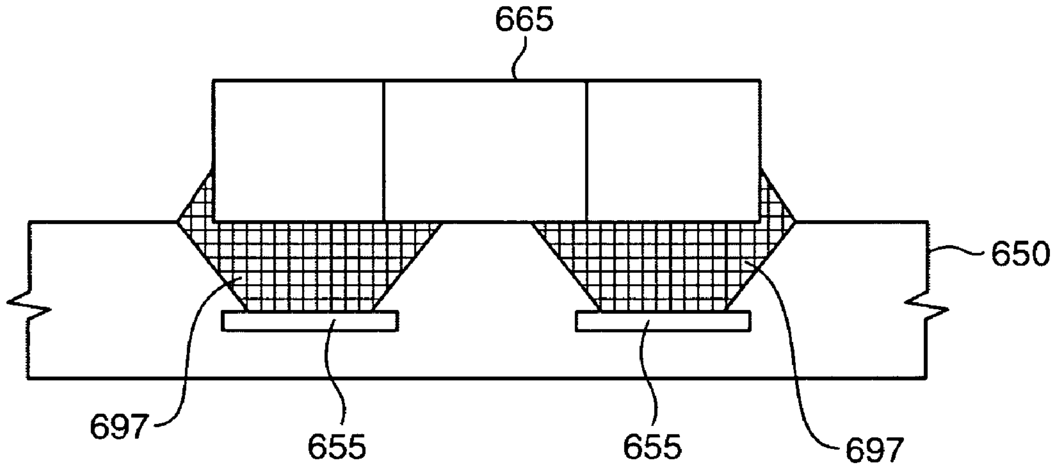
FIG. 10 shows an assembly after optionally removing the holder of FIG. 9, according to one or more embodiments of the invention.

FIG. 10 shows an assembly after optionally removing the holder of FIG. 9, according to one or more embodiments of the invention. It is not required that the holder be removed, although it may be removed in certain embodiments. In one or more embodiments of the invention, the holder may be removed with the use of a deflux solution in a deflux operation. One suitable deflux solution includes hot water, such as, for example, deionized water having a temperature of from about 90 to 100° C., which may optionally be applied under pressure. Other suitable deflux solutions may optionally include one or more solvents. Suitable solvents include, but are not limited to, chloroflorocarbons, alcohols, mineral spirits, terpenes, and combinations thereof. Organic materials that may be included in the holder may have increased solubility and dissolution in deflux solutions including such organic solvents.

However, the invention is not limited to removing the holder by using a conventional deflux solution. The holder may also optionally be removed by contact with a solvent that may be suitable for dissolving the holder, such as, for example, acetone, or another suitable organic solvent, in one aspect in which the holder includes an organic material. Alternatively, the holder may optionally be removed physically by scraping, or pealing, to name just a few examples.

Figure 11:
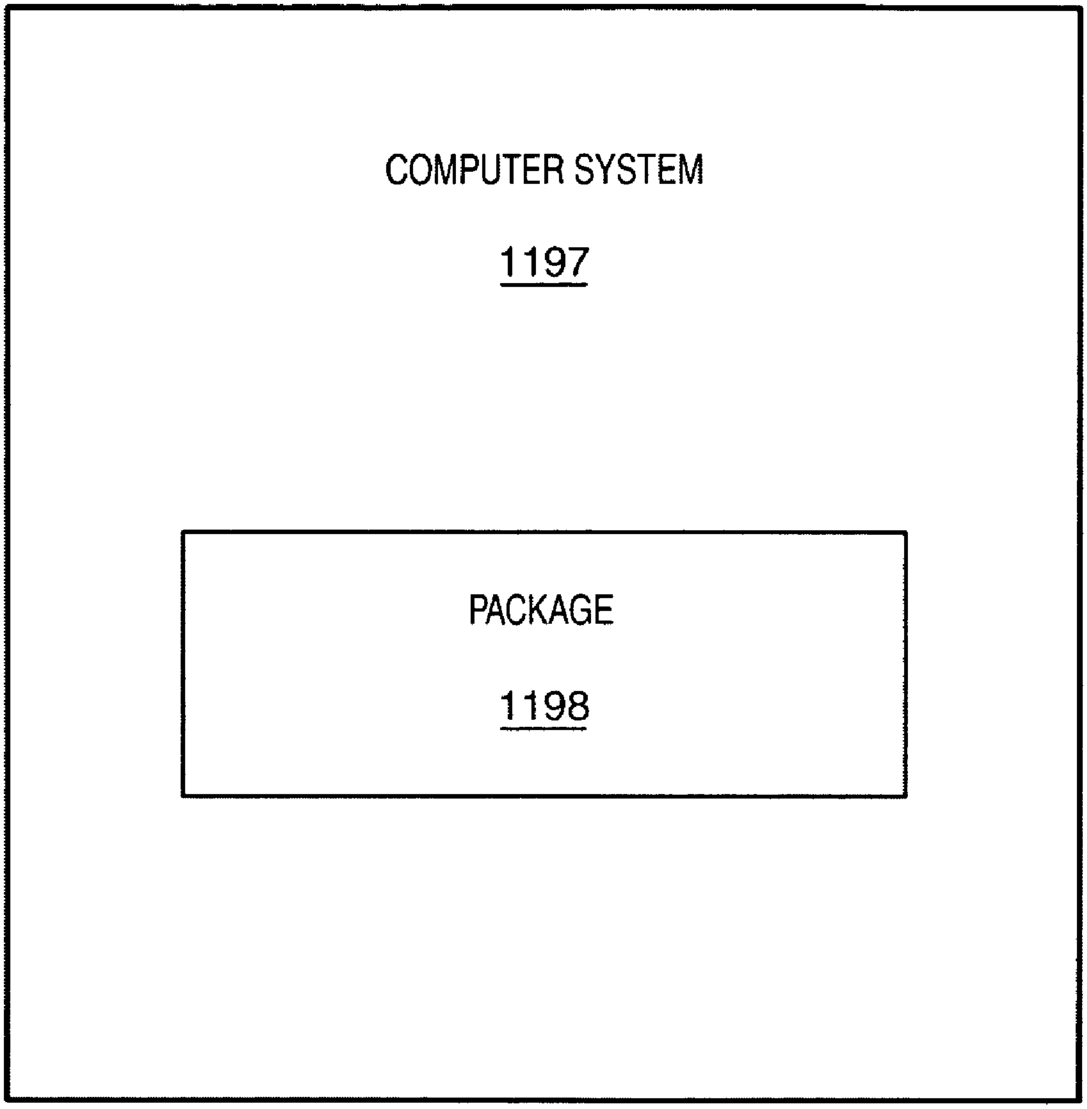
FIG. 11 shows a computer system including a package which may include a holder as disclosed herein, according to one or more embodiments of the invention.

As discussed above, the holder need not necessarily be removed from the substrate, although it may be. In one or more embodiments of the invention, the substrate having the holder may be used to form a microelectronic package for a chipset component, such as, for example, a microprocessor, of a computer system. FIG. 11 shows a computer system 1197 including a package 1198, which may include a substrate, microelectronic device, and holder as disclosed herein, according to one or more embodiments of the invention. The computer system may include a desktop, laptop, or server, to name just a few examples. The package may be included in the computer system along with other conventional components, such as, for example, a bus, a processor coupled with the bus, and a memory coupled with the bus. Suitable memories that are used in some, but not all, computer systems include DRAM, SRAM, and Flash memories. The computer system may optionally include a graphics controller and/or audio device, which may be coupled with the bus. Graphics controllers and/or audio devices are included in some, but not all, computer systems. However, other embodiments of the invention are not limited to this use. For example, in one or more embodiments of the invention, the holder may be used to mount a device on a motherboard or daughterboard, for example.

In the description above, for the purposes of explanation, numerous specific details have been set forth in order to provide a thorough understanding of the embodiments of the invention. It will be apparent, however, to one skilled in the art, that other embodiments may be practiced without some of these specific details. In other instances, well-known circuits, structures, devices, and techniques have been shown in block diagram form or without detail in order not to obscure the understanding of this description.

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one embodiment", "an embodiment", or "one or more embodiments" means that a particular feature may be included in the practice of the invention. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. An apparatus comprising:

a printed circuit board;

a plurality of lands on a surface of the printed circuit board;

solder coupled with the plurality of lands;

a capacitor coupled with the solder; and a layer around a region of the printed circuit board including the capacitor to hold the capacitor in place during solder reflow, wherein the layer comprises an oblique sidewall including an overhang over the region including the capacitor.

2. An apparatus comprising:

a printed circuit board;

a plurality of lands on a surface of the printed circuit board;

solder coupled with the plurality of lands;

a capacitor coupled with the solder; and a layer around a region of the printed circuit board including the capacitor to bold the capacitor in place during solder reflow, wherein the layer comprises a thickness that is greater than a height of the capacitor as coupled with the solder.

3. The apparatus of claim 1, wherein the layer comprises an organic material.

4. An apparatus comprising:

a printed circuit board;

a plurality of lands on a surface of the printed circuit board;

solder coupled with the plurality of lands;

a capacitor coupled with the solder; and a layer around a region of the printed circuit board including the capacitor to hold the capacitor in place during solder reflow.

wherein the layer comprises a material having a coefficient of thermal expansion tat is greater than that of the printed circuit board.

5. The apparatus of claim 1, wherein the layer comprises a material that is soluble in a deflux solution.

6. The apparatus of claim 1, wherein the layer comprises a polymeric material that is thermally stable to a reflow temperature of the solder.

7. An apparatus comprising:

a substrate;

a plurality of terminals coupled with the substrate;

a conductive bonding material coupled with the plurality of terminals;

an electronic device coupled with the conductive bonding material; and a holder that is coupled with the substrate to hold the electronic device, wherein the holder comprises a material having a coefficient of thermal expansion that is greater than that of the substrate.

8. The apparatus of claim 7, wherein the holder comprises a material that is soluble in a deflux solution.

9. The apparatus of claim 7, wherein the holder comprises a polymeric material that is thermally stable up to at least 260°C.

10. The apparatus of claim 7, wherein the substrate comprises a printed circuit board, wherein the conductive bonding material comprises a solder, wherein the electronic device comprises an electronic device selected from the group consisting of a capacitor, a resistor, an inductor, and a transistor, and wherein the holder comprises a layer around a periphery of a region of the printed circuit board including the electronic device.

11. The apparatus of claim 7, wherein the holder comprises a layer around a region of the substrate including the electronic device.

12. The apparatus of claim 11, wherein the layer comprises an oblique sidewall.

13. The apparatus of claim 12, wherein the oblique sidewall comprises an overhang over the region including the electronic device.

14. The apparatus of claim 11, wherein the layer comprises a thickness that is greater than a height of the electronic device as coupled with the conductive bonding material.

15. The apparatus of claim 7, wherein the holder comprises an organic material.

16. The apparatus of claim 1, wherein the oblique sidewall slants toward the capacitor.

17. The apparatus of claim 1, wherein the oblique sidewall is to contact the capacitor at a reflow temperature of the solder.

18. The apparatus of claim 1:

wherein the layer comprises a thickness that is greater than a height of the capacitor as coupled with the solder;

wherein the layer comprises a material having a coefficient of thermal expansion that is greater than that of the printed circuit board; and wherein the layer comprises a polymeric material that is thermally stable to a reflow temperature of the solder.

19. The apparatus of claim 1, further comprising a DRAM memory.

* * * * *

UNITED STATES PATENT AND TRADEMARK OFFICE

CERTIFICATE OF CORRECTION

PATENT NO. : 7,295,445 B2
APPLICATION NO. : 10/954463
DATED : November 13, 2007
INVENTOR(S) : My It is certified that error appears in the above-identified patent and that said Letters Patent is hereby corrected as shown below:

In column 8, at line 26, delete “bold”, and insert --hold--.

In column 8, at line 43, delete “tat”, and insert --that--.

Signed and Sealed this

Fifteenth Day of April, 2008

JON W. DUDAS
*Director of the United States Patent and Trademark Office*